US012772595B2

(12) United States Patent
Nakata

(10) Patent No.: US 12,772,595 B2
(45) Date of Patent: Oct. 20, 2026

(54) PHOTOELECTRIC CONVERSION DEVICE HAVING EXPANDED DYNAMIC RANGE AND TRANSFER ELECTRODES

(71) Applicant: CANON KABUSHIKI KAISHA, Tokyo (JP)

(72) Inventor: Yasushi Nakata, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 485 days.

(21) Appl. No.: 18/323,230

(22) Filed: May 24, 2023

(65) Prior Publication Data

US 2023/0387173 A1 Nov. 30, 2023

(30) Foreign Application Priority Data

May 27, 2022 (JP) ................................ 2022-086894
Dec. 23, 2022 (JP) ................................ 2022-206388

(51) Int. Cl.
*H10F 39/00* (2025.01)
*H04N 25/702* (2023.01)
(Continued)

(52) U.S. Cl.
CPC ......... *H10F 39/811* (2025.01); *H04N 25/702* (2023.01); *H04N 25/772* (2023.01);
(Continued)

(58) Field of Classification Search
CPC ............... H10F 39/811; H10F 39/8027; H10F 39/8063; H10F 39/807; H04N 25/702;
(Continued)

(56) References Cited

U.S. PATENT DOCUMENTS 9,935,142 B2 * 4/2018 Hwangbo ............. H10F 39/014
2003/0141564 A1 * 7/2003 Kondo .................. H10F 39/151
257/E27.152
(Continued)

FOREIGN PATENT DOCUMENTS

JP 2003218343 A 7/2003
JP 2004319837 A 11/2004
(Continued)

*Primary Examiner* — Yara B Green
*Assistant Examiner* — Akhee Sarker-Nag
(74) *Attorney, Agent, or Firm* — Canon U.S.A., Inc. IP Division

(57) ABSTRACT

A photoelectric conversion device includes first and second photoelectric conversion circuits, a floating diffusion portion, first and second transfer electrodes, and a first control electrode. The second photoelectric conversion circuit has sensitivity lower than that of the first photoelectric conversion circuit. Charges generated in the first photoelectric conversion circuit and the second photoelectric conversion circuit are transferred to the floating diffusion portion. The first transfer electrode is configured to transfer charges from the first photoelectric conversion circuit to the floating diffusion portion. The second transfer electrode is configured to transfer charges from the second photoelectric conversion circuit to the floating diffusion portion. The first control electrode is configured to control a potential between the first photoelectric conversion circuit and the second photoelectric conversion circuit so that charges are movable between the first photoelectric conversion circuit and the second photoelectric conversion circuit.

17 Claims, 8 Drawing Sheets

(51) Int. Cl.
*H04N 25/772* (2023.01)
*H04N 25/779* (2023.01)
*H04N 25/78* (2023.01)

(52) U.S. Cl.
CPC ..... *H10F 39/8027* (2025.01); *H10F 39/8063* (2025.01); *H10F 39/807* (2025.01); *H04N 25/779* (2023.01); *H04N 25/78* (2023.01)

(58) Field of Classification Search
CPC .... H04N 25/772; H04N 25/779; H04N 25/78; H04N 25/46; H04N 25/778; H04N 25/79
See application file for complete search history.

(56) References Cited

U.S. PATENT DOCUMENTS

| | | | | |
|---|---|---|---|---|
| 2015/0001589 | A1* | 1/2015 | Tazoe | H10F 39/014 257/229 |
| 2017/0012066 | A1* | 1/2017 | Choi | H10F 39/807 |
| 2018/0269245 | A1 | 9/2018 | Mlinar et al. | |
| 2019/0096933 | A1* | 3/2019 | Kido | H10F 39/8027 |
| 2019/0131333 | A1 | 5/2019 | Borthakur et al. | |
| 2019/0371848 | A1* | 12/2019 | Ikeda | H10F 39/18 |
| 2020/0236313 | A1* | 7/2020 | Lee | H04N 25/76 |
| 2023/0018370 | A1* | 1/2023 | Asatsuma | H04N 25/621 |
| 2023/0352508 | A1* | 11/2023 | Huang | H10F 39/811 |
| 2024/0038815 | A1* | 2/2024 | Yamashita | H10F 39/8023 |

FOREIGN PATENT DOCUMENTS

| | | | |
|---|---|---|---|
| JP | 2007329721 | A | 12/2007 |
| JP | 2013041890 | A | 2/2013 |
| JP | 2017212351 | A | 11/2017 |
| WO | 2017169754 | A1 | 10/2017 |

* cited by examiner

PHOTOELECTRIC CONVERSION DEVICE HAVING EXPANDED DYNAMIC RANGE AND TRANSFER ELECTRODES

BACKGROUND

Technical Field

One disclosed aspect of the embodiments relates to a photoelectric conversion device.

Description of the Related Art

In recent years, there has been a demand for expanding a dynamic range of a photoelectric conversion device. For example, in applications such as a vehicle-mounted camera and a security camera, a photoelectric conversion device with an expanded dynamic range can perform suitable imaging even in an environment in which a difference in brightness is large due to backlight or the like.

As one of techniques that can expand the dynamic range, there is a technique of combining a plurality of photodiodes having different characteristics each other. Japanese Patent Application Laid-Open No. 2003-218343, Japanese Patent Application Laid-Open No. 2007-329721, U.S. Patent Application Publication No. 2018/0269245, and U.S. Patent Application Publication No. 2019/0131333 disclose examples of photoelectric conversion devices including a plurality of photodiodes having different characteristics each other.

In a photoelectric conversion device including a plurality of photodiodes having different characteristics each other as described in Japanese Patent Application Laid-Open No. 2003-218343, Japanese Patent Application Laid-Open No. 2007-329721, U.S. Patent Application Publication No. 2018/0269245, and U.S. Patent Application Publication No. 2019/0131333, there are cases where it is required to further expand the dynamic range depending on applications.

SUMMARY

According to a disclosure of the present specification, a photoelectric conversion device includes a first photoelectric conversion circuit, a second photoelectric conversion circuit, a floating diffusion portion, a first transfer electrode, a second transfer electrode, and a first control electrode. The second photoelectric conversion circuit has sensitivity lower than that of the first photoelectric conversion circuit. Charges generated in the first photoelectric conversion circuit and the second photoelectric conversion circuit are transferred to the floating diffusion portion. The first transfer electrode is configured to transfer charges from the first photoelectric conversion circuit to the floating diffusion portion. The second transfer electrode is configured to transfer charges from the second photoelectric conversion circuit to the floating diffusion portion. The first control electrode is configured to control a potential between the first photoelectric conversion circuit and the second photoelectric conversion circuit so that charges are movable between the first photoelectric conversion circuit and the second photoelectric conversion circuit.

Further features of the disclosure will become apparent from the following description of exemplary embodiments with reference to the attached drawings.

DESCRIPTION OF THE EMBODIMENTS

Figure 1:
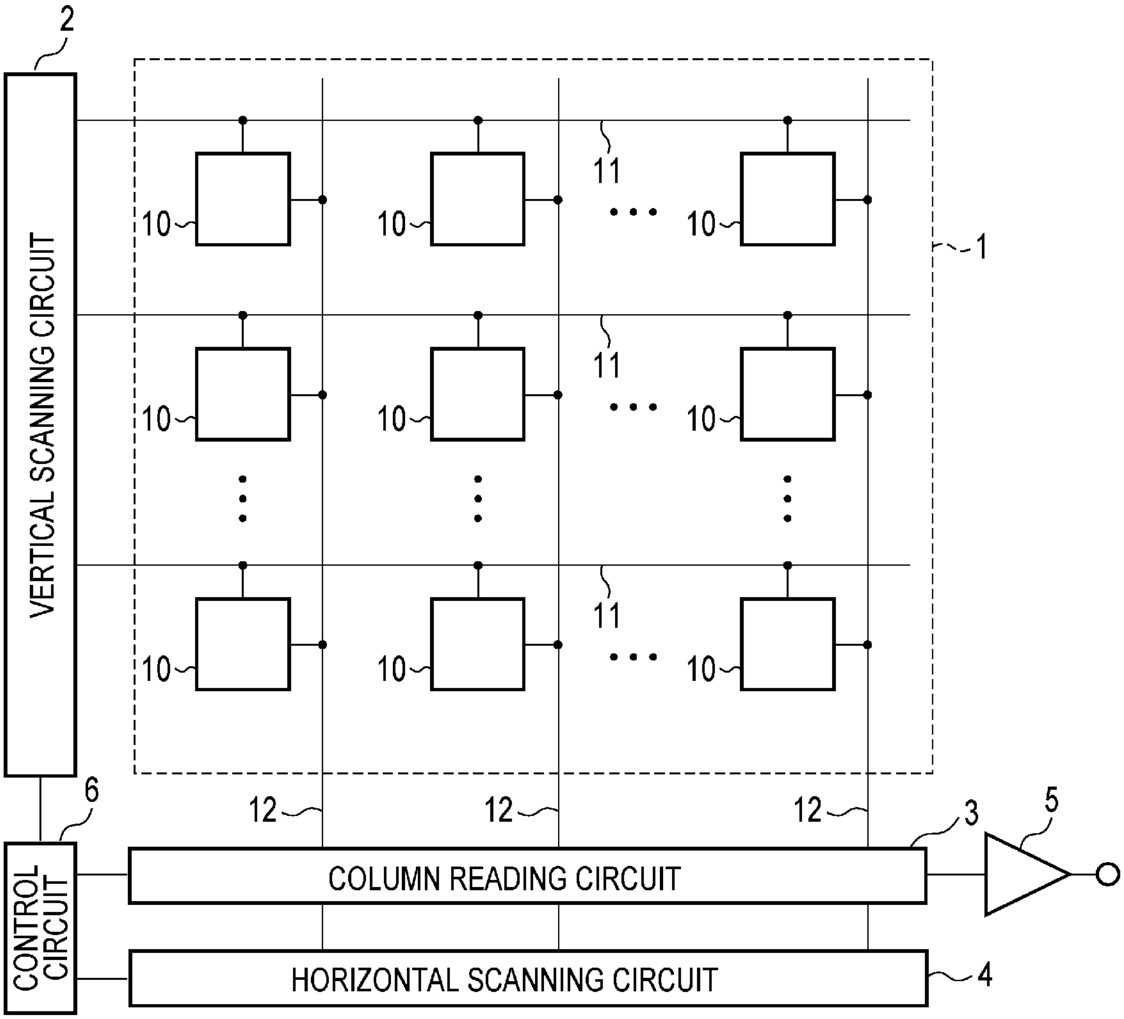
FIG. 1 is a block diagram illustrating a schematic configuration of a photoelectric conversion device according to a first embodiment.

Embodiments of the disclosure will now be described with reference to the accompanying drawings. In the drawings, the same or corresponding elements are denoted by the same reference numerals, and the description thereof may be omitted or simplified. In the following, the term "unit" may have different meanings depending on the context. The usual meaning is an individual element, single and complete. The phrase "units of" may refer to a plurality of elements or a group of elements. In addition, the term "unit" may refer to a software context, a hardware context, or a combination of software and hardware contexts. In the software context, the term "unit" refers to a functionality, an application, a software module, a function, a routine, a set of instructions, or a program that can be executed by a programmable processor such as a microprocessor, a central processing unit (CPU), or a specially designed programmable device or controller. A memory contains instructions or program that, when executed by the CPU, cause the CPU to perform operations corresponding to units or functions. In the hardware context, the term "unit" refers to a hardware element, a circuit, an assembly, a physical structure, a system, a module, or a subsystem. It may include mechanical, optical, or electrical components, or any combination of them. It may include active (e.g., transistors) or passive (e.g., capacitor) components. It may include semiconductor devices having a substrate and other layers of materials having various concentrations of conductivity. It may include a CPU or a programmable processor that can execute a program stored in a memory to perform specified functions. It may include logic elements (e.g., AND, OR) implemented by transistor circuits or any other switching circuits. In the combination of software and hardware contexts, the term "unit" or "circuit" refers to any combination of the software and hardware contexts as described above. In addition, the term "element," "assembly," "component," or "device" may also refer to "circuit" with or without integration with packaging materials. Furthermore, depending on the context, the term "portion," "part," "device," "switch," or similar terms may refer to a circuit or a group of circuits. The circuit or group of circuits may include electronic, mechanical, or optical elements such as capacitors, diodes, transistors. For example, a switch is a circuit that turns on and turns off a connection. It can be implemented by a transistor circuit or similar electronic devices.

In the following first to third embodiments, an imaging device will be mainly described as an example of a photoelectric conversion device. However, the photoelectric conversion device of each embodiment is not limited to the imaging device, and can be applied to other devices. Examples of other devices include a ranging device and a photometry device. The ranging device may be, for example, a focus detection device, a distance measuring device using a time-of-flight (TOF), or the like. The photometry device may be a device for measuring the amount of light incident on the device. Although a PN junction photodiode is used for the photoelectric conversion circuit in each embodiment, a single photon avalanche diode (SPAD) may be used.

First Embodiment

FIG. 1 is a block diagram illustrating a schematic configuration of a photoelectric conversion device according to the present embodiment. The photoelectric conversion device of the present embodiment includes a pixel array 1, a vertical scanning circuit 2, a column reading circuit 3, a horizontal scanning circuit 4, an output circuit 5, and a control circuit 6. The circuit constituting the photoelectric conversion device may be formed in one or more semiconductor substrates.

The pixel array 1 includes a plurality of pixels 10 arranged in a plurality of rows and a plurality of columns. Each of the plurality of pixels 10 generates charges by photoelectrically converting incident light and outputs a signal corresponding to the incident light.

In each row of the pixel array 1, a plurality of control lines 11 are arranged so as to extend in a first direction (the lateral direction in FIG. 1). Each of the plurality of control lines 11 is connected to the pixels 10 arranged in the first direction, and serves as a signal line common to the pixels 10. The first direction in which the control lines 11 extend may be referred to as a row direction or a horizontal direction. The control lines 11 are connected to the vertical scanning circuit 2.

In each column of the pixel array 1, an output line 12 is arranged so as to extend in a second direction (vertical direction in FIG. 1) intersecting with the first direction. Each of the output lines 12 is connected to the pixels 10 arranged in the second direction, and serves as a signal line common to the pixels 10. The second direction in which the output lines 12 extend may be referred to as a column direction or a vertical direction. Each of the output lines 12 is connected to a current source 13 and a column reading circuit 3, which will be described later with reference to FIG. 2.

The control circuit 6 outputs control signals such as a vertical synchronization signal, a horizontal synchronization signal, and a clock signal to the vertical scanning circuit 2, the column reading circuit 3, and the horizontal scanning circuit 4. Thus, the control circuit 6 controls the operation of these circuits.

The vertical scanning circuit 2 is a scanning circuit including logic circuits such as a shift register, a gate circuit, and a buffer circuit. The vertical scanning circuit 2 outputs control signals to the pixel 10 via the control lines 11 based on a vertical synchronization signal, a horizontal synchronization signal, a clock signal, and the like, and sequentially outputs signals from the pixel 10 on a row basis. The vertical scanning circuit 2 controls a charge accumulation period in the pixel 10.

The signal generated by the pixel 10 is output to the column reading circuit 3 via the output line 12 of the corresponding column. The column reading circuit 3 includes column circuits corresponding to the respective columns. The column circuit performs processing such as amplification and analog-to-digital conversion on the signal input through the output line 12, and holds the processed signal on a column basis.

The horizontal scanning circuit 4 is a scanning circuit including logic circuits such as a shift register, a gate circuit, and a buffer circuit. The horizontal scanning circuit 4 sequentially selects the plurality of column circuits of the column reading circuit 3. Thus, each of the plurality of column circuits sequentially outputs the held signal to the output circuit 5. The output circuit 5 outputs signals in a predetermined format to the outside of the photoelectric conversion device.

Figure 2:
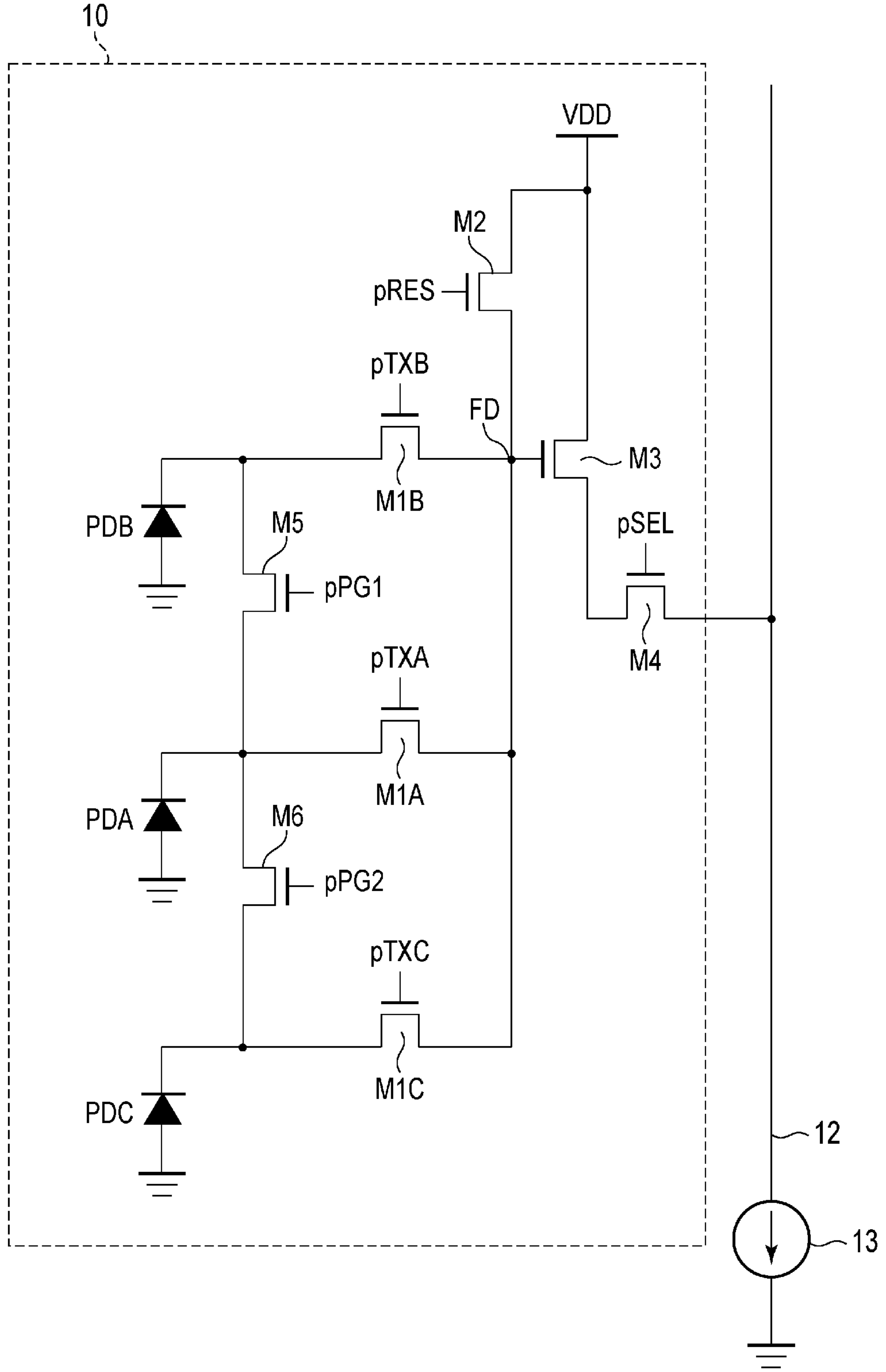
FIG. 2 is an equivalent circuit diagram of a pixel according to the first embodiment.

FIG. 2 is an equivalent circuit diagram of the pixel 10 according to the present embodiment. In the following description, it is assumed that the charges accumulated in the photoelectric conversion unit or circuit in the pixel 10 are electrons. All the transistors included in the pixel 10 are N-type MOS transistors. However, the charges accumulated in the photoelectric conversion circuit may be holes, and in this case, the transistors of the pixel 10 may be P-type MOS transistors. That is, the conductivity type of the transistors or the like can be changed as appropriate depending on the polarity of charges handled as a signal.

The pixel 10 includes photoelectric conversion units or circuits PDA, PDB, and PDC, transfer transistors M1A, M1B, and M1C, a reset transistor M2, an amplification transistor M3, a selection transistor M4, and element connection transistors M5 and M6. The photoelectric conversion circuits PDA, PDB, and PDC (first photoelectric conversion circuit, second photoelectric conversion circuit, and third photoelectric conversion circuit) are, for example, photodiodes. The anodes of the photoelectric conversion circuits PDA, PDB, and PDC are connected to a ground node. The cathode of the photoelectric conversion circuit PDA is connected to the source of the element connection transistor M5, the source of the element connection transistor M6, and the source of the transfer transistor M1A. The cathode of the photoelectric conversion circuit PDB is connected to the drain of the element connection transistor M5 and the source of the transfer transistor M1B. The cathode of the photoelectric conversion circuit PDC is connected to the drain of the element connection transistor M6 and the source of the transfer transistor M1C.

The drains of the transfer transistors M1A, M1B, and M1C are connected to the source of the reset transistor M2 and the gate of the amplification transistor M3. A node to which the drains of the transfer transistors M1A, M1B, and M1C, the source of the reset transistor M2, and the gate of the amplification transistor M3 are connected is a floating diffusion portion FD. The term "portion" refers to a physical part or component of a device. It may correspond to an area or a region. The floating diffusion portion FD has a capacitance component (floating diffusion capacitance) and functions as a charge holding portion. The floating diffusion capacitance includes parasitic capacitance of an electrical path from the transfer transistors M1A, M1B, and M1C to the amplification transistor M3 via the floating diffusion portion FD.

The drain of the reset transistor M2 and the drain of the amplification transistor M3 are connected to a power supply voltage node to which a voltage VDD is supplied. The source of the amplification transistor M3 is connected to the drain of the selection transistor M4. The source of the selection transistor M4 is connected to the output line 12.

A current source 13 is connected to the output line 12. The current source 13 may be a current source whose current value can be changed or a constant current source whose current value is constant.

In the case of the pixel configuration of FIG. 2, the control lines 11 of each row includes signal lines connected to the gates of the transfer transistors M1A, M1B, and M1C, the reset transistor M2, the selection transistor M4, and the element connection transistors M5 and M6. Control signals pTXA, pTXB, and pTXC are supplied from the vertical scanning circuit 2 to gates of the transfer transistors M1A, M1B, and M1C, respectively. A control signal pRES is supplied from the vertical scanning circuit 2 to the gate of the reset transistor M2. A control signal pSEL is supplied from the vertical scanning circuit 2 to the gate of the selection transistor M4. Control signals pPG1 and pPG2 are supplied from the vertical scanning circuit 2 to gates of the element connection transistors M5 and M6, respectively. A plurality of pixels 10 in the same row are connected to common signal lines, and are controlled at the same time by common control signals.

In the present embodiment, each transistor constituting the pixel 10 is an N-type MOS transistor. Therefore, when a high-level control signal is supplied from the vertical scanning circuit 2, the corresponding transistor is turned on. When a low-level control signal is supplied from the vertical scanning circuit 2, the corresponding transistor is turned off. The term "source" or "drain" of the MOS transistor may vary depending on the conductivity type of the transistor or the target function. Some or all of terms of "source" and "drain" used in the present embodiment are sometimes referred to as opposite terms.

Each of the photoelectric conversion circuits PDA, PDB, and PDC converts (photoelectrically converts) incident light into an amount of charges corresponding to an amount of the incident light. When the transfer transistor M1A is turned on, the charges held in the photoelectric conversion circuit PDA is transferred to the floating diffusion portion FD. When the transfer transistor M1B is turned on, the charges held in the photoelectric conversion circuit PDB is transferred to the floating diffusion portion FD. When the transfer transistor M1C is turned on, the charges held in the photoelectric conversion circuit PDC is transferred to the floating diffusion portion FD. The charges transferred from the photoelectric conversion circuits PDA, PDB, and PDC are held in the capacitance (floating diffusion capacitance) of the floating diffusion portion FD. As a result, the floating diffusion portion FD has a potential corresponding to the amount of charges transferred from the photoelectric conversion circuits PDA, PDB, and PDC by the charge-to-voltage conversion by the floating diffusion capacitance.

When the element connection transistor M5 is turned on, the potential of the semiconductor region between the photoelectric conversion circuit PDA and the photoelectric conversion circuit PDB is controlled to a state in which the charges accumulated in them are movable. When the element connection transistor M6 is turned on, the potential of the semiconductor region between the photoelectric conversion circuit PDA and the photoelectric conversion circuit PDC is controlled to a state in which the charges accumulated in them are movable. Thus, the element connection transistors M5 and M6 have a function of adding charges accumulated in a plurality of photoelectric conversion circuits. Therefore, when the element connection transistor M5 or the element connection transistor M6 is on, each transfer transistor can transfer charges transferred from photoelectric conversion circuits other than the corresponding photoelectric conversion circuit.

The selection transistor M4 is turned on to connect the amplification transistor M3 to the output line 12. The amplification transistor M3 is configured such that the voltage VDD is supplied to the drain and a bias current is supplied from the current source 13 to the source via the selection transistor M4, and constitutes an amplification circuit (source follower circuit) having a gate as an input node. Accordingly, the amplification transistor M3 outputs a signal based on the potential of the floating diffusion portion FD to the output line 12 through the selection transistor M4. In this sense, the amplification transistor M3 and the selection transistor M4 are output circuits that output pixel signals corresponding to the amount of charges held in the floating diffusion portion FD.

The reset transistor M2 has a function of resetting the floating diffusion portion FD by controlling supply of a voltage (voltage VDD) to the floating diffusion portion FD. When the reset transistor M2 is turned on, the floating diffusion portion FD is reset to a voltage corresponding to the voltage VDD.

Although FIG. 2 illustrates a configuration in which a signal is output to the corresponding output line 12 through one selection transistor M4, the configuration of the selection transistor M4 and the output line 12 is not limited thereto. For example, in a configuration in which a plurality of selection transistors M4 and a plurality of output lines 12 are arranged for one pixel 10, a configuration may be adopted in which output lines 12 for outputting signals can be selected by individually controlling the plurality of selection transistors M4.

Figure 3:
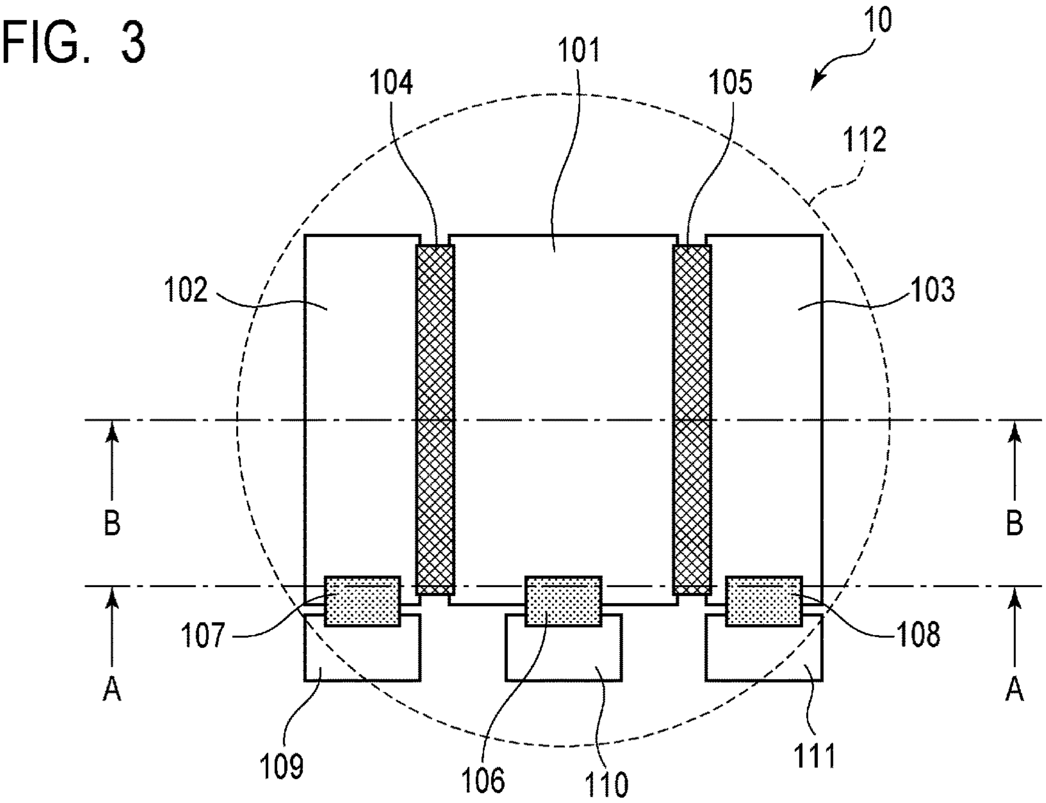
FIG. 3 is a schematic plan view of the pixel according to the first embodiment.
Figure 4:
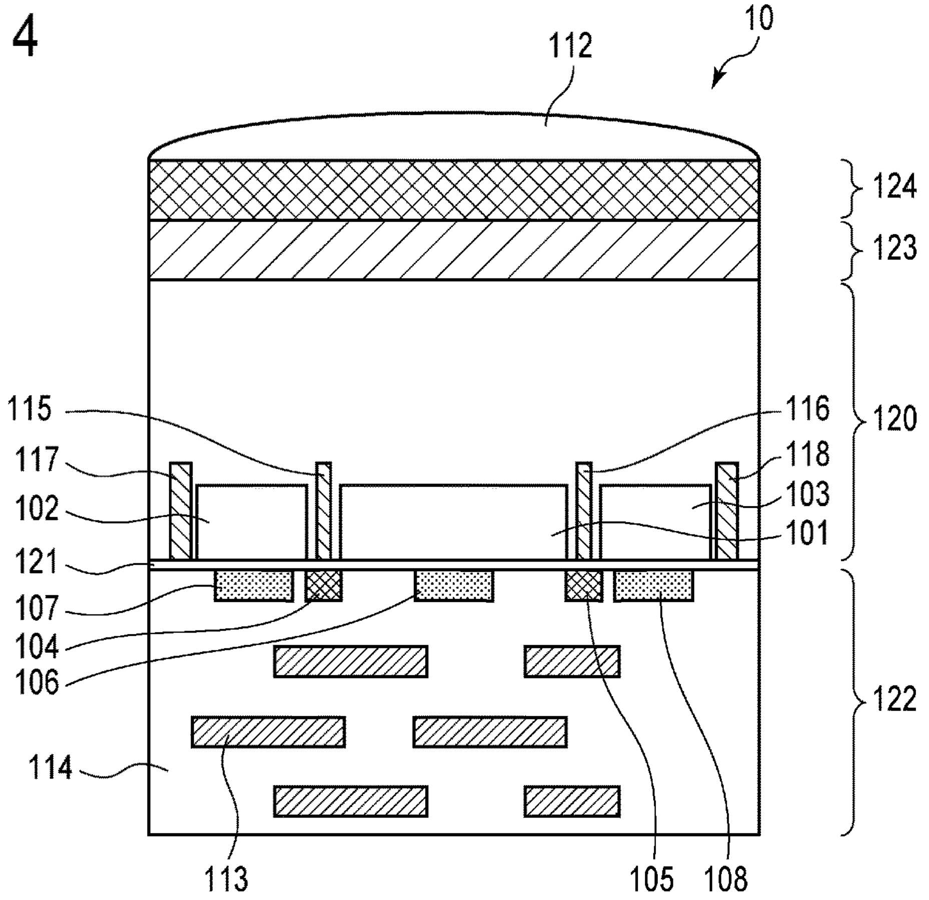
FIG. 4 is a schematic cross-sectional view of the pixel according to the first embodiment.

FIG. 3 is a schematic plan view of the pixel 10 according to the present embodiment. FIG. 3 schematically illustrates an arrangement of semiconductor regions and the gate electrodes constituting the photoelectric conversion circuits PDA, PDB, and PDC, the floating diffusion portion FD, and the transistors, and an arrangement of an on-chip lens 112 in a plan view with respect to the substrate. FIG. 4 is a schematic cross-sectional view of the pixel 10 according to the present embodiment. FIG. 4 schematically illustrates a cross section taken along a line A-A of FIG. 3. The structure of the pixel of the present embodiment will be described with reference to FIGS. 3 and 4.

FIG. 3 illustrates semiconductor regions 101, 102, 103, 109, 110, and 111, potential control electrodes 104 and 105, and transfer electrodes 106, 107, and 108 constituting the pixel 10. The semiconductor regions 101, 102, and 103 are impurity diffusion regions constituting the photoelectric conversion circuits PDA, PDB, and PDC, respectively. The semiconductor regions 109, 110, and 111 are impurity diffusion regions constituting the floating diffusion portion FD. The semiconductor region 101 has a quadrangular shape, and the semiconductor regions 102 and 103 are arranged along two opposed sides of the four sides of the semiconductor region 101.

The potential control electrode 104 (first control electrode) controls the potential between the photoelectric conversion circuit PDA and the photoelectric conversion circuit PDB. The potential control electrode 104 is arranged between the semiconductor region 101 and the semiconductor region 102. The potential control electrode 105 (second control electrode) controls the potential between the photoelectric conversion circuit PDA and the photoelectric conversion circuit PDC. The potential control electrode 105 is arranged between the semiconductor region 101 and the semiconductor region 103. That is, the potential control electrodes 104 and 105 function as gates of the element connection transistors M5 and M6, respectively.

The transfer electrodes 106, 107, and 108 (first transfer electrode, second transfer electrode, and third transfer electrode) are electrodes for transferring charges from the photoelectric conversion circuits PDA, PDB, and PDC to the floating diffusion portion FD, respectively. The transfer electrodes 106, 107, and 108 are arranged between the semiconductor regions 101, 102, and 103 and the semiconductor regions 110, 109, and 111, respectively. That is, the transfer electrodes 106, 107, and 108 function as gates of the transfer transistors M1A, M1B, and M1C, respectively.

As illustrated in FIG. 4, an oxide film 121 and a wiring layer 122 are arranged in this order on one face (first face) of a semiconductor substrate 120 in which the photoelectric conversion circuits PDA, PDB, and PDC are arranged. A planarization layer 123, a color filter layer 124, and an on-chip lens 112 (first lens) are arranged in this order on another face (second face) of the semiconductor substrate 120 facing the first face. As described above, the photoelectric conversion device of the present embodiment has a structure in which incident light is irradiated from the second face side opposite to the first face side on which the wiring layer 122 is arranged, and is a so-called back-illuminated CMOS image sensor. The on-chip lens 112 is arranged so as to cover at least the photoelectric conversion circuit PDA, and guides incident light to at least the photoelectric conversion circuit PDA.

The wiring layer 122 includes a plurality of wirings 113 arranged so as to be buried in the interlayer insulating film 114. The plurality of wirings 113 are arranged over a plurality of layers. The plurality of wirings 113 are used for reading out signals from the photoelectric conversion circuits PDA, PDB, and PDC, transmitting control signals, and the like.

The face of the wiring layer 122 opposite to the oxide film 121 may be supported by a substrate support member (not illustrated). For example, a signal processing circuit such as an analog-to-digital conversion circuit may be arranged on the substrate support member side, and the processing speed may be increased. Such a photoelectric conversion device is sometimes referred to as a stacked CMOS image sensor.

In the wiring layer 122, transfer electrodes 106, 107, and 108 are arranged at positions corresponding to the semiconductor regions 101, 102, and 103 with an oxide film 121 interposed therebetween. The oxide film 121 is an insulating oxide. The oxide film 121 functions as a gate insulating film of the MOS transistor by insulating the first face side of the semiconductor substrate 120. When control signals pTXA, pTXB, and pTXC having predetermined voltages are applied to the transfer electrodes 106, 107, and 108, charges accumulated in the photoelectric conversion circuits PDA, PDB, and PDC are transferred to the floating diffusion portion FD, respectively.

The semiconductor substrate 120 is further provided with semiconductor regions 115, 116, 117, and 118. The semiconductor region 115 separates the photoelectric conversion circuit PDA from the photoelectric conversion circuit PDB. The semiconductor region 116 separates the photoelectric conversion circuit PDA from the photoelectric conversion circuit PDC. The semiconductor regions 117 and 118 separate the pixel 10 illustrated in FIG. 4 from other elements (for example, pixels adjacent to the pixel 10 illustrated in FIG. 4).

In the wiring layer 122, potential control electrodes 104 and 105 are arranged at positions corresponding to the semiconductor regions 115 and 116 with an oxide film 121 interposed therebetween. By applying the control signal pPG1 of a predetermined voltage to the potential control electrode 104, the potential of the semiconductor region between the photoelectric conversion circuits PDA and PDB decreases. As a result, the potential is controlled so that the charges accumulated in the photoelectric conversion circuits PDA and PDB are movable between them. Further, by applying the control signal pPG2 of a predetermined voltage to the potential control electrode 105, the potential of the semiconductor region between the photoelectric conversion circuits PDA and PDC decreases. As a result, the potential is controlled so that the charges accumulated in the photoelectric conversion circuits PDA and PDC are movable between them.

Figure 5:
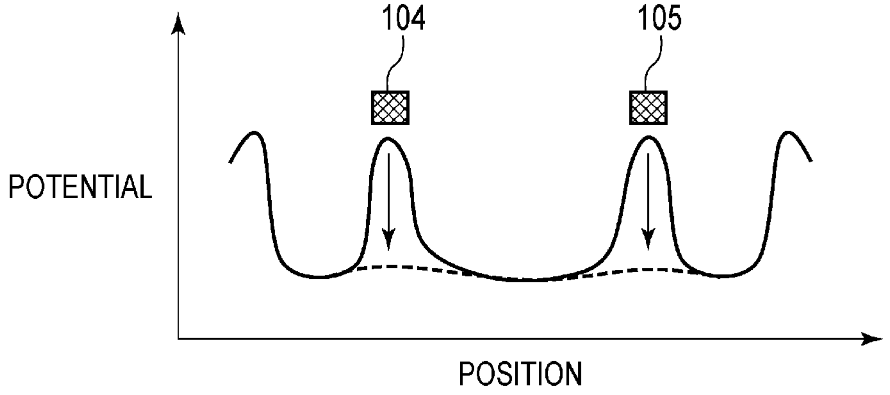
FIG. 5 is a diagram schematically illustrating a potential in the pixel according to the first embodiment.

FIG. 5 is a diagram schematically illustrating a potential in the pixel according to the present embodiment. FIG. 5 schematically illustrates the potential along the line B-B of FIG. 3. The horizontal axis of FIG. 5 represents the position on the line B-B of FIG. 3, and the vertical axis of FIG. 5 represents the potential. A solid line in FIG. 5 indicates a potential in a state in which the control signals pPG1 and pPG2 of the predetermined voltage are not applied to the potential control electrodes 104 and 105 (that is, a state in which the element connection transistors M5 and M6 are off). A broken line in FIG. 5 indicates a potential in a state in which the control signals pPG1 and pPG2 of the predetermined voltage are applied to the potential control electrodes 104 and 105 (that is, a state in which the element connection transistors M5 and M6 are on). As can be understood from the broken line in FIG. 5, by applying the control signals pPG1 and pPG2 of the predetermined voltage to the potential control electrodes 104 and 105, the potentials of the semiconductor regions 115 and 116 are lowered. As a result, charges are movable between the photoelectric conversion circuits PDA, PDB, and PDC.

In the present embodiment, the sensitivity of the photoelectric conversion circuit PDB formed by the semiconductor region 102 is lower than the sensitivity of the photoelectric conversion circuit PDA formed by the semiconductor region 101. Further, the sensitivity of the photoelectric conversion circuit PDC formed by the semiconductor region 103 is lower than the sensitivity of the photoelectric conversion circuit PDA formed by the semiconductor region 101. In this way, by providing two or more photoelectric conversion circuits having different sensitivities, and varying the method of outputting signals depending on the illuminance, it is possible to expand the dynamic range. For example, when the illuminance is low, a signal based on charges accumulated in the photoelectric conversion circuit PDA is read out, whereby the sensitivity can be improved. In addition, when the illuminance is high, a signal based on charges accumulated in the photoelectric conversion circuit PDB or the photoelectric conversion circuit PDC having relatively low sensitivity is read out, whereby the signal is less likely to be saturated. Thereby, the sensitivity at low illuminance is improved and the signal saturation at high illuminance is suppressed, and thus the dynamic range is expanded.

Further, in the present embodiment, at low illuminance, the control signals pPG1 and pPG2 of the predetermined voltage are applied to the potential control electrodes 104 and 105 so that charges are movable between the photoelectric conversion circuits PDA, PDB, and PDC. Thereby, the charges generated in the photoelectric conversion circuits PDA, PDB, and PDC are added at low illuminance. In this case, the light receiving area substantially increases from the area of the photoelectric conversion circuit PDA to the total area of the photoelectric conversion circuits PDA, PDB, and PDC. This increases signal-to-noise ratio (SNR) at low illuminance.

Figure 6:
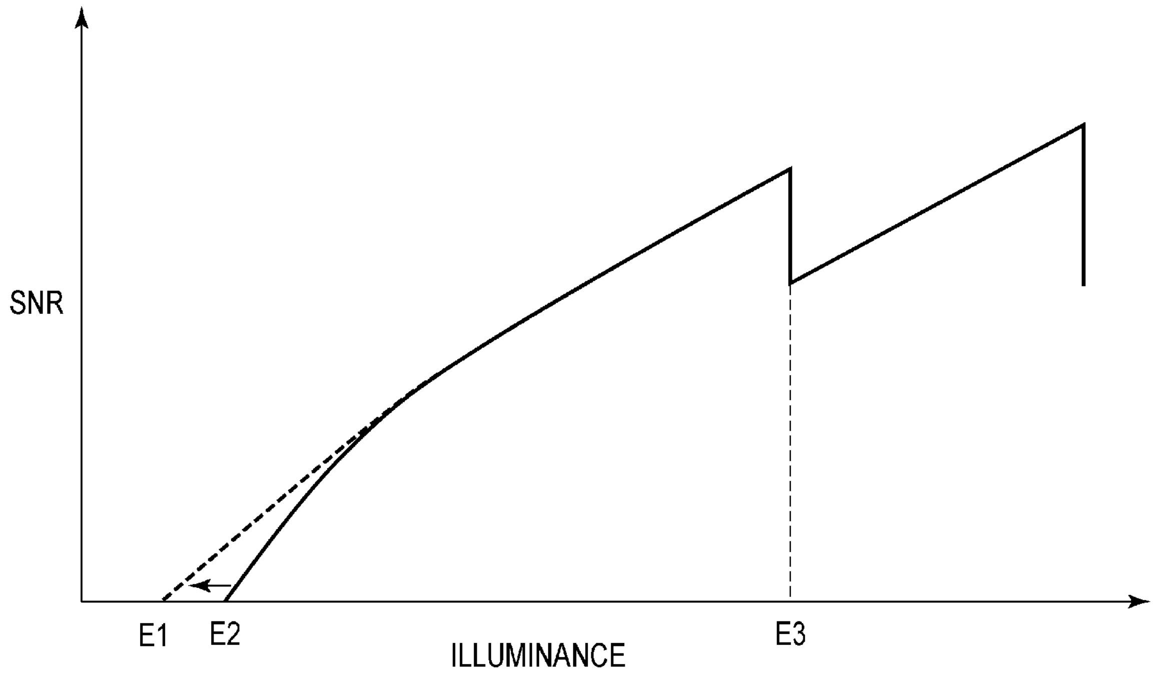
FIG. 6 is a graph schematically illustrating a relationship between illuminance and SNR according to the first embodiment.

FIG. 6 is a graph schematically illustrating a relationship between illuminance and SNR according to the present embodiment. The horizontal axis of FIG. 6 represents illuminance of light incident on the pixel 10, and the vertical axis of FIG. 6 represents SNR. The illuminance E3 in FIG. 6 indicates a threshold value at which the operation at low illuminance and the operation at high illuminance are switched. That is, when the illuminance of the incident light to the photoelectric conversion device is less than E3, the reading operation at low illuminance is performed, and when the illuminance of the incident light to the photoelectric conversion device is equal to or greater than E3, the reading operation at high illuminance is performed. Thereby, at the illuminance E3, a step occurs in the value of the SNR due to the switching of the operation.

The solid line in FIG. 6 indicates the SNR in a state in which the control signals pPG1 and pPG2 of the predetermined voltage are not applied to the potential control electrodes 104 and 105 (that is, a state in which the element connection transistors M5 and M6 are off). In other words, the solid line in FIG. 6 can be understood as a comparative example without the potential control electrodes 104 and 105. The illuminance E2 in FIG. 6 indicates a minimum illuminance at which a signal can be acquired in this state.

The broken line in FIG. 6 indicates the SNR in a state in which the control signals pPG1 and pPG2 of the predetermined voltage are applied to the potential control electrodes 104 and 105 (that is, a state in which the element connection transistors M5 and M6 are on). The illuminance E1 in FIG. 6 indicates a minimum illuminance at which a signal can be acquired in this state.

As can be understood by comparing the solid line and the broken line in the vicinity of the illuminance E1 and the illuminance E2 in FIG. 6, by making a state in which charges are movable between the photoelectric conversion circuits PDA, PDB, and PDC, charges generated by them are added, so that the minimum illuminance is lowered. Therefore, signal acquisition is possible even at a lower illuminance, and the dynamic range is further increased.

As described above, according to the present embodiment, the potential control electrodes 104 and 105 are arranged, and the charges are movable between the photoelectric conversion circuits PDA, PDB, and PDC, whereby the photoelectric conversion device capable of further expanding the dynamic range is provided.

In addition, by making a state in which charges are movable between the photoelectric conversion circuits PDA, PDB, and PDC, charges can be moved to other photoelectric conversion circuits even when light that saturates the photoelectric conversion circuit PDA with high sensitivity is incident. That is, the saturation charge amount substantially increases from the value of the photoelectric conversion circuit PDA to the sum of the photoelectric conversion circuits PDA, PDB, and PDC. Thereby, the influence of saturation is reduced, and the illuminance range in which high sensitivity reading can be performed can be expanded.

In the above description, one high sensitivity photoelectric conversion circuit PDA and two low sensitivity photoelectric conversion circuits PDB and PDC are arranged, but the number of these photoelectric conversion circuits is not particularly limited. That is, a pixel structure including one or more photoelectric conversion circuits with high sensitivity and one or more photoelectric conversion circuits with low sensitivity may be used.

There are no particular restrictions on the structure in which the sensitivity difference is given such that the sensitivity of the photoelectric conversion circuits PDB and PDC is lower than that of the photoelectric conversion circuit PDA. As an example of the structure for giving the sensitivity difference, as illustrated in FIGS. 2 and 3, the area of the light receiving face of the photoelectric conversion circuit PDA is made larger than the area of the light receiving face of the photoelectric conversion circuit PDB or the photoelectric conversion circuit PDC in a plan view. As a result, a larger amount of light is incident on the photoelectric conversion circuit PDA than on the photoelectric conversion circuit PDB or the photoelectric conversion circuit PDC, so that the sensitivity of the photoelectric conversion circuit PDA can be higher than the sensitivity of the photoelectric conversion circuit PDB or the photoelectric conversion circuit PDC.

As another structure, as illustrated in FIGS. 2 and 3, the photoelectric conversion circuit PDA is arranged near the center of the on-chip lens 112, in particular, on the optical axis of the on-chip lens 112, and the photoelectric conversion circuit PDB or the photoelectric conversion circuit PDC is arranged outside the photoelectric conversion circuit PDA. Since the on-chip lens 112 concentrates more light on the photoelectric conversion circuit PDA, the sensitivity of the photoelectric conversion circuit PDA may be higher than the sensitivity of the photoelectric conversion circuit PDB or the photoelectric conversion circuit PDC.

In addition, in charge transfer at low illuminance, it is more desirable to use only the transfer transistor M1A (transfer electrode 106) than using the transfer transistors M1A, M1B, and M1C (transfer electrodes 106, 107, and 108). This reduces noise caused by transfer.

The impurity concentration of the semiconductor region 101 is preferably higher than the impurity concentration of the semiconductor region 102 or the semiconductor region 103. This realizes a potential structure in which charges generated in the photoelectric conversion circuit PDB or the photoelectric conversion circuit PDC are likely to move to the photoelectric conversion circuit PDA. Therefore, the charges generated in the photoelectric conversion circuit PDB or the photoelectric conversion circuit PDC are less likely to remain in the photoelectric conversion circuit PDB or the photoelectric conversion circuit PDC at the time of transfer, and the accuracy is further improved.

Second Embodiment

In the present embodiment, a modified example of the planar structure of the pixel 10 of the first embodiment will be described. Descriptions of the same portions as those of the first embodiment will be omitted.

Figure 7:
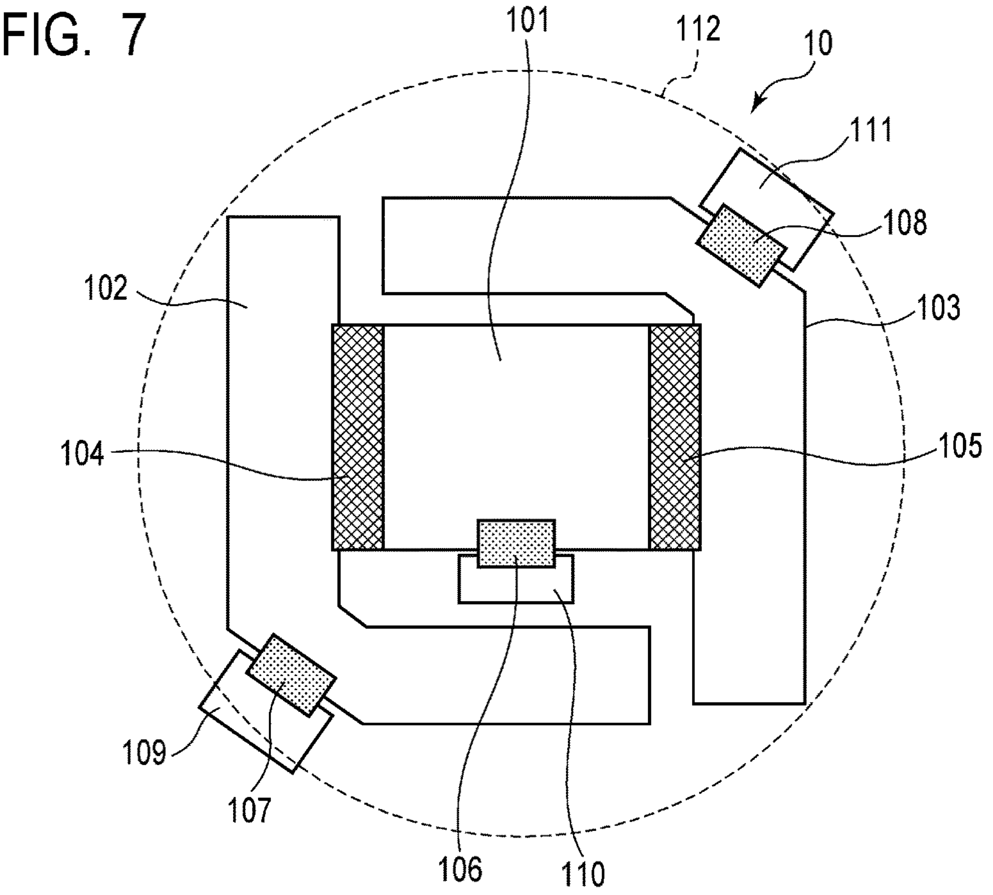
FIG. 7 is a schematic plan view of the pixel according to a second embodiment.

FIG. 7 is a schematic plan view of the pixel 10 according to the present embodiment. As illustrated in FIG. 7, a semiconductor region 101 constituting the photoelectric conversion circuit PDA is arranged on the optical axis of the on-chip lens 112. The semiconductor region 101 has a quadrangular shape. A semiconductor region 102 constituting the photoelectric conversion circuit PDB and a semiconductor region 103 constituting the photoelectric conversion circuit PDC are arranged outside the semiconductor region 101, that is, outside the optical axis of the on-chip lens 112. The semiconductor region 102 is arranged along two adjacent sides among the four sides of the outer periphery of the semiconductor region 101, and the semiconductor region 103 is arranged along the other two sides of the semiconductor region 101. That is, the semiconductor region 102 and the semiconductor region 103 are arranged so as to surround the semiconductor region 101. By arranging the semiconductor regions 101, 102, and 103 in this manner, the light-collecting range of the on-chip lens 112 can be efficiently utilized.

Also in this embodiment, similarly to the first embodiment, a photoelectric conversion device capable of expanding the dynamic range is provided. By arranging the on-chip lens 112 and the semiconductor regions 101, 102, and 103 as described above, a large amount of light collected by the on-chip lens 112 is concentrated on the photoelectric conversion circuit PDA. This makes it possible to further increase the difference between the sensitivity of the photoelectric conversion circuit PDA and the sensitivity of the photoelectric conversion circuit PDB or the photoelectric conversion circuit PDC.

Note that the planar shape of the semiconductor region 101 is not limited to a quadrangular shape. The planar shape of the semiconductor region 101 desirably enables efficient placement of the semiconductor regions 102 and 103 surrounding the semiconductor region 101. For example, the planar shape of the semiconductor region 101 is preferably a polygon having four or more sides, and the planar shape of the semiconductor regions 102 and 103 is preferably a shape along two or more sides of the semiconductor region 101.

Third Embodiment

In the present embodiment, a modified example of the cross-sectional structure of the pixel 10 of the first embodiment will be described. Descriptions of the same portions as those of the first embodiment will be omitted.

Figure 8:
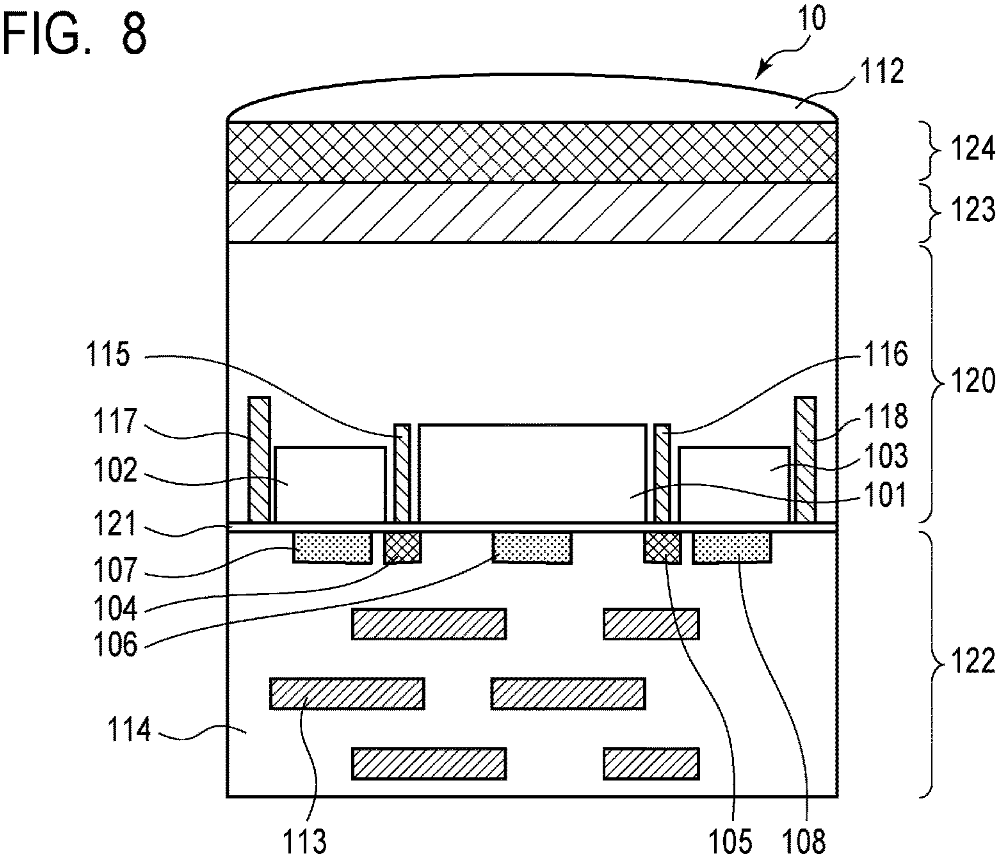
FIG. 8 is a schematic cross-sectional view of the pixel according to a third embodiment.

FIG. 8 is a schematic cross-sectional view of the pixel 10 according to the present embodiment. As illustrated in FIG. 8, in the light incident direction, the semiconductor region 101 constituting the photoelectric conversion circuit PDA is longer than the semiconductor region 102 constituting the photoelectric conversion circuit PDB or the semiconductor region 103 constituting the photoelectric conversion circuit PDC. In other words, the depth of the semiconductor region 101 viewed from the first face is deeper than the depth of the semiconductor region 102 or the semiconductor region 103 viewed from the first face. Therefore, the efficiency of photoelectric conversion in the photoelectric conversion circuit PDA is higher than the efficiency of photoelectric conversion in the photoelectric conversion circuit PDB or the photoelectric conversion circuit PDC. This makes it possible to further increase the difference between the sensitivity of the photoelectric conversion circuit PDA and the sensitivity of the photoelectric conversion circuit PDB or the photoelectric conversion circuit PDC.

Also in this embodiment, similarly to the first embodiment, a photoelectric conversion device capable of expanding the dynamic range is provided. Further, by making the photoelectric conversion circuit PDA thicker than the photoelectric conversion circuit PDB or the photoelectric conversion circuit PDC as described above, it is possible to further increase the difference between the sensitivity of the photoelectric conversion circuit PDA and the sensitivity of the photoelectric conversion circuit PDB or the photoelectric conversion circuit PDC.

As illustrated in FIG. 8, the semiconductor regions 117 and 118 (first element isolation regions) are longer than the semiconductor regions 115 and 116 (second element isolation regions) in the light incident direction. In other words, the depth of the semiconductor regions 117 and 118 viewed from the first face is deeper than the depth of the semiconductor regions 115 and 116 viewed from the first face. That is, the element isolation portion between the pixel 10 and other elements (for example, pixels adjacent to the pixel 10 illustrated in FIG. 8) is arranged at a deeper position than the element isolation portion between the photoelectric conversion circuits. This reduces the leakage of charges from the pixel 10 to other elements. According to this configuration, the sensitivity at the time of addition of charges of the photoelectric conversion circuits PDA, PDB, and PDC can be improved.

Fourth Embodiment

In the present embodiment, a modified example of the structure of the on-chip lens of the pixel 10 of the first embodiment will be described. Descriptions of the same portions as those of the first embodiment will be omitted.

Figure 9:
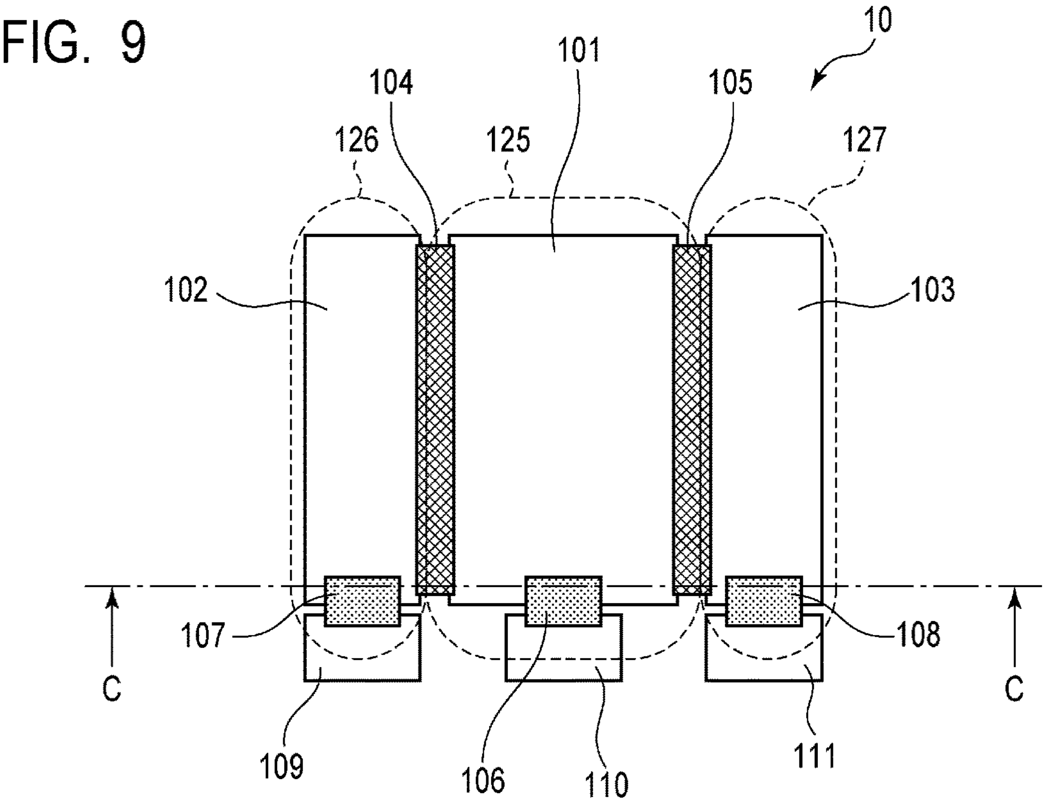
FIG. 9 is a schematic plan view of the pixel according to a fourth embodiment.
Figure 10:
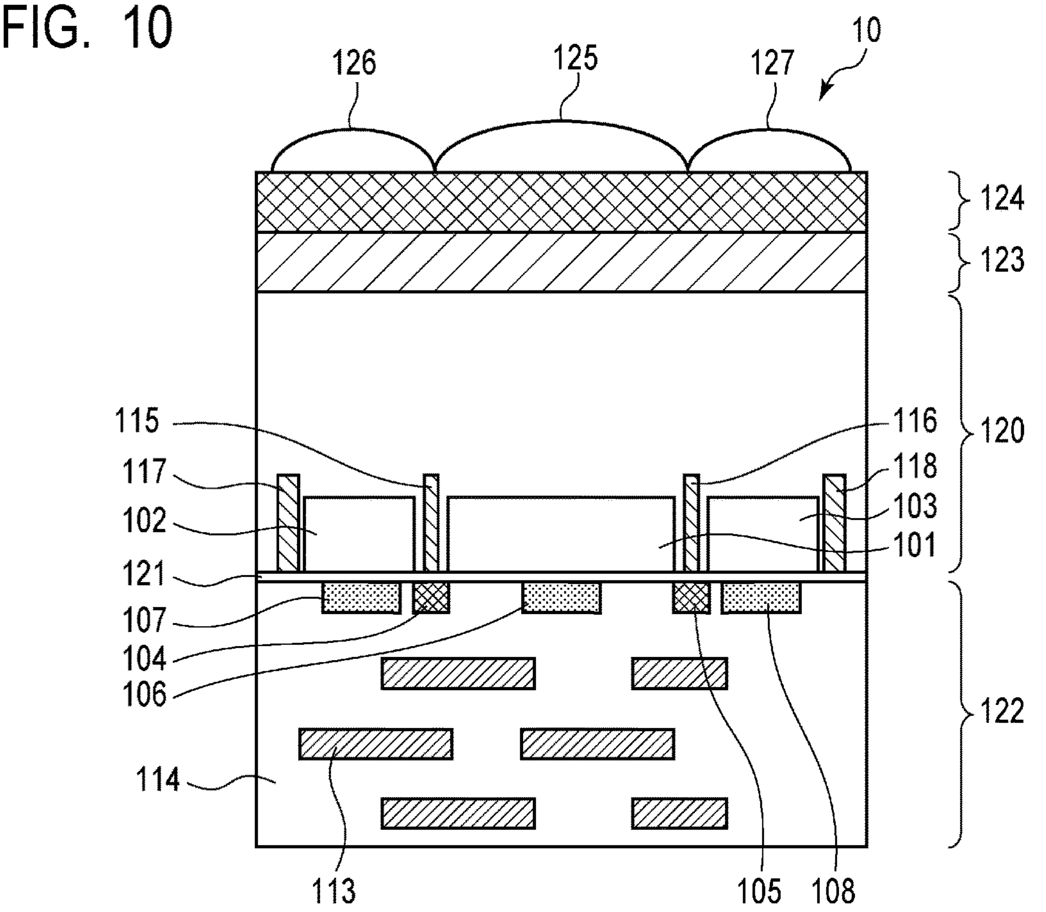
FIG. 10 is a schematic cross-sectional view of the pixel according to the fourth embodiment.

FIG. 9 is a schematic plan view of the pixel 10 according to the present embodiment. FIG. 10 is a schematic cross-sectional view of the pixel 10 according to the present embodiment. FIG. 10 schematically illustrates a cross section taken along a line C-C of FIG. 9. The structure of the pixel 10 of the present embodiment will be described with reference to FIGS. 9 and 10.

As illustrated in FIGS. 9 and 10, in the pixel 10 of the present embodiment, on-chip lenses 125, 126, and 127 are arranged instead of the on-chip lens 112 of FIGS. 3 and 4. The on-chip lenses 125, 126, and 127 are arranged corresponding to the photoelectric conversion circuits PDA, PDB, and PDC, respectively. In the light incident direction, the on-chip lens 125 (first lens) is arranged so as to cover the photoelectric conversion circuit PDA. In the light incident direction, the on-chip lens 126 (second lens) is arranged so as to cover at least a part of the photoelectric conversion circuit PDB. In the light incident direction, the on-chip lens 127 is arranged so as to cover at least a part of the photoelectric conversion circuit PDC. The on-chip lens 125 guides incident light mainly to the photoelectric conversion circuit PDA. The on-chip lens 126 guides incident light mainly to the photoelectric conversion circuit PDB. The on-chip lens 127 guides incident light mainly to the photoelectric conversion circuit PDC.

In the present embodiment, a plurality of on-chip lenses 125, 126, and 127 are arranged corresponding to the plurality of photoelectric conversion circuits PDA, PDB, and PDC, respectively. Thus, the on-chip lens 125 can efficiently concentrate incident light on the photoelectric conversion circuit PDA. The area of each of the on-chip lenses 126 and 127 in plan view is smaller than the area of the on-chip lens 125 in plan view. Thus, the amount of light incident on each of the photoelectric conversion circuits PDB and PDC via the on-chip lenses 126 and 127 is less than the amount of light incident on the photoelectric conversion circuit PDA. Such a relationship between the incident light amounts can be achieved by appropriately adjusting the area and position of each on-chip lens. The height of the on-chip lens 125 and the height of the on-chip lenses 126 and 127 may be different from each other. In FIG. 9, each of the on-chip lenses 125, 126, and 127 is depicted as an oval-shaped on-chip lens, but the shape of the lens is not limited thereto. The on-chip lenses 125, 126, and 127 may have, for example, a perfect circular shape depending on the shape of the photoelectric conversion circuits PDA, PDB, and PDC, or on-chip lenses may have different shapes each other.

Also in the present embodiment, similarly to the first embodiment, a photoelectric conversion device capable of expanding the dynamic range is provided. Further, since the plurality of on-chip lenses 125, 126, and 127 are arranged corresponding to the plurality of photoelectric conversion circuits PDA, PDB, and PDC, respectively, the design of the area, height, position, and the like of the plurality of on-chip lenses 125, 126, and 127 can be individually adjusted. Therefore, the amount of light incident on each of the photoelectric conversion circuits PDA, PDB, and PDC can be adjusted effectively, and design adjustment for expanding the dynamic range can be performed more suitably.

Fifth Embodiment

Figure 11:
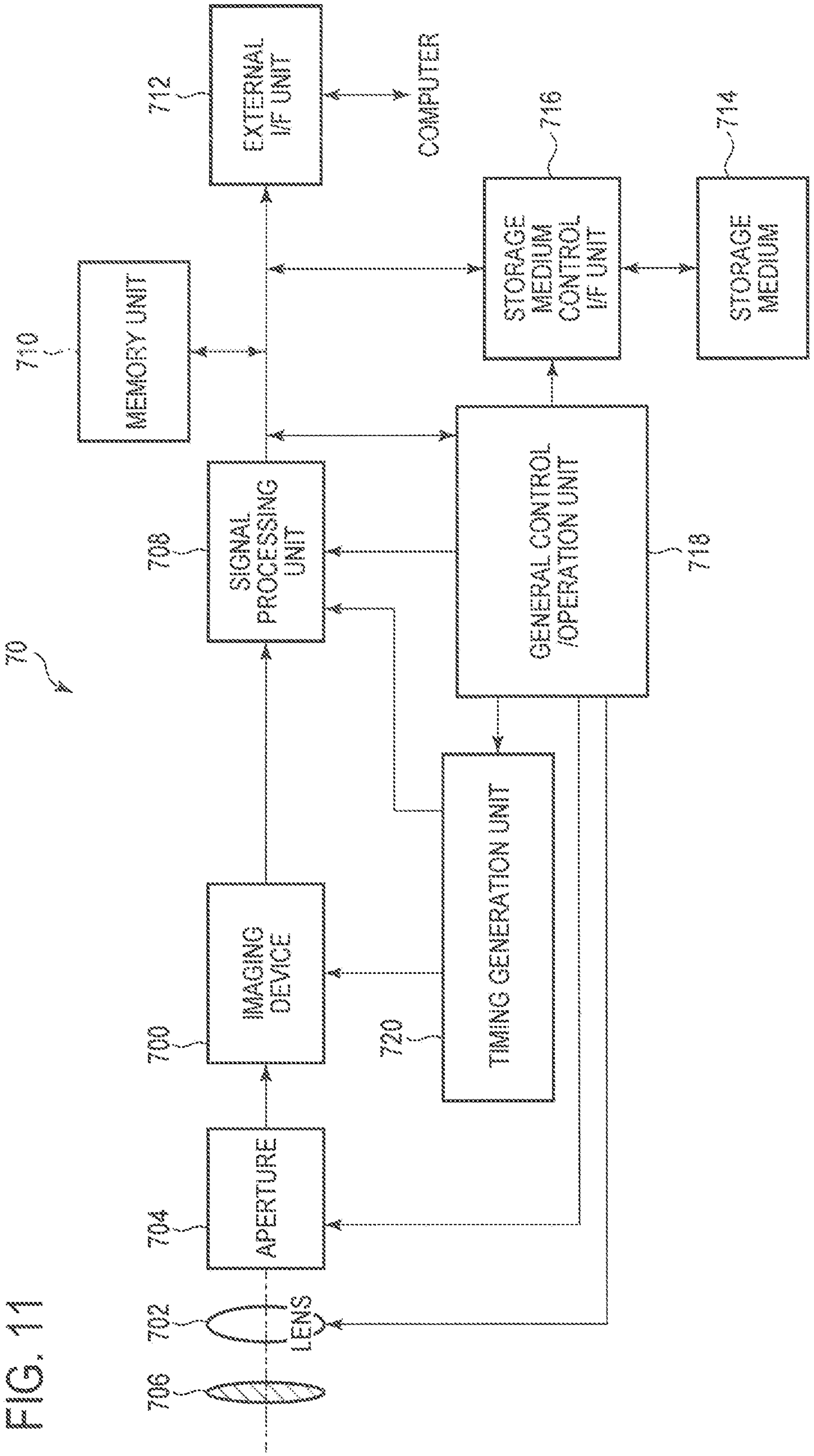
FIG. 11 is a block diagram of equipment according to a fifth embodiment.

The photoelectric conversion device of the above embodiments can be applied to various equipment. Examples of the equipment include a digital still camera, a digital camcorder, a camera head, a copying machine, a facsimile, a mobile phone, a vehicle-mounted camera, an observation satellite, and a surveillance camera. FIG. 11 is a block diagram of a digital still camera as an example of equipment.

The equipment 70 illustrated in FIG. 11 includes a barrier 706, a lens 702, an aperture 704, and an imaging device 700 (an example of the photoelectric conversion device). The equipment 70 further includes a signal processing circuit (processing device) 708, a timing generation circuit 720, a general control/operation circuit 718 (control device), a memory circuit 710 (storage device), a storage medium control I/F circuit 716, a storage medium 714, and an external I/F circuit 712. At least one of the barrier 706, the lens 702, and the aperture 704 is an optical device corresponding to the equipment. The barrier 706 protects the lens 702, and the lens 702 forms an optical image of an object on the imaging device 700. The aperture 704 varies the amount of light passing through the lens 702. The imaging device 700 is configured as in the above embodiments, and converts an optical image formed by the lens 702 into image data (image signal). The signal processing circuit 708 performs various corrections, data compression, and the like on the imaging data output from the imaging device 700. The timing generation circuit 720 outputs various timing signals to the imaging device 700 and the signal processing circuit 708. The general control/operation circuit 718 controls the entire digital still camera, and the memory circuit 710 temporarily stores image data. The storage medium control I/F circuit 716 is an interface for storing or reading image data on the storage medium 714, and the storage medium 714 is a detachable storage medium such as a semiconductor memory for storing or reading captured image data. The external I/F circuit 712 is an interface for communicating with an external computer or the like. The timing signal or the like may be input from the outside of the equipment. The equipment 70 may further include a display device (a monitor, an electronic view finder, or the like) for displaying information obtained by the photoelectric conversion device. The equipment includes at least a photoelectric conversion device. Further, the equipment 70 includes at least one of an optical device, a control device, a processing device, a display device, a storage device, and a mechanical device that operates based on information obtained by the photoelectric conversion device. The mechanical device is a movable portion (for example, a robot arm) that receives a signal from the photoelectric conversion device for operation.

Each pixel may include a plurality of photoelectric conversion circuits (a first photoelectric conversion circuit and a second photoelectric conversion circuit). The signal processing circuit 708 may be configured to process a pixel signal based on charges generated in the first photoelectric conversion circuit and a pixel signal based on charges generated in the second photoelectric conversion circuit, and acquire distance information from the imaging device 700 to an object.

Sixth Embodiment

Figure 12A:
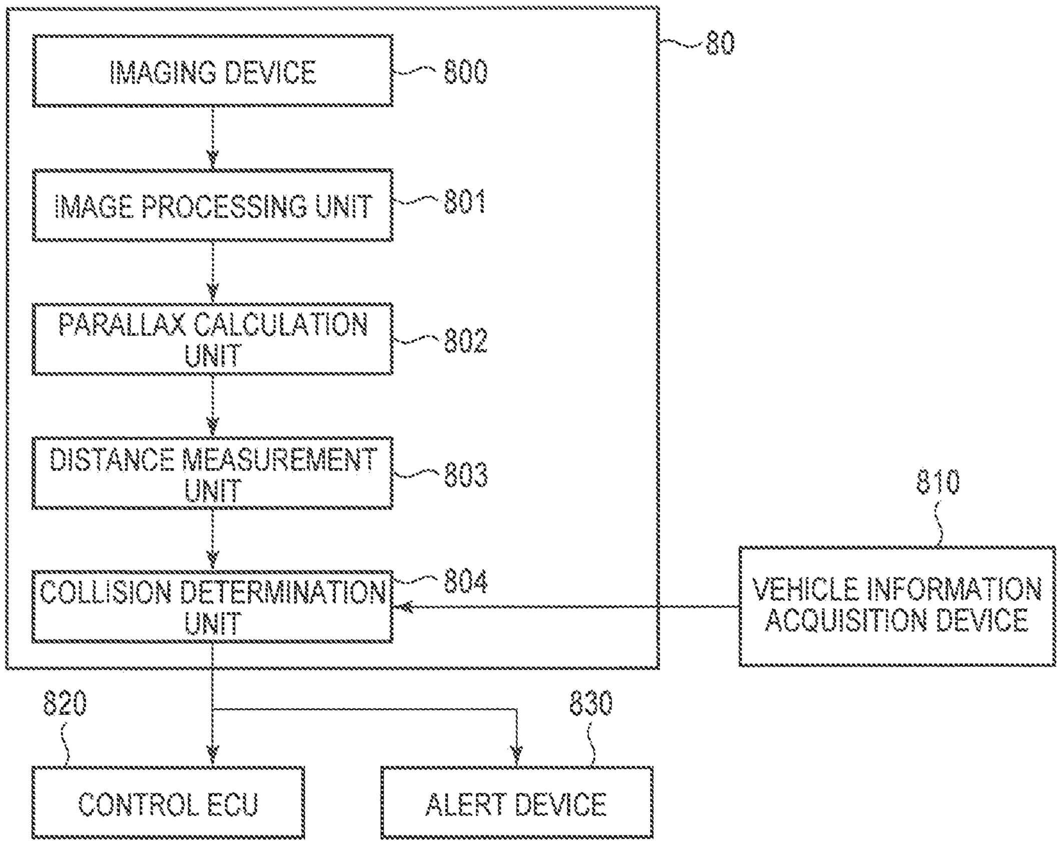
FIGS. 12A and 12B are block diagrams of equipment according to a sixth embodiment.
Figure 12B:
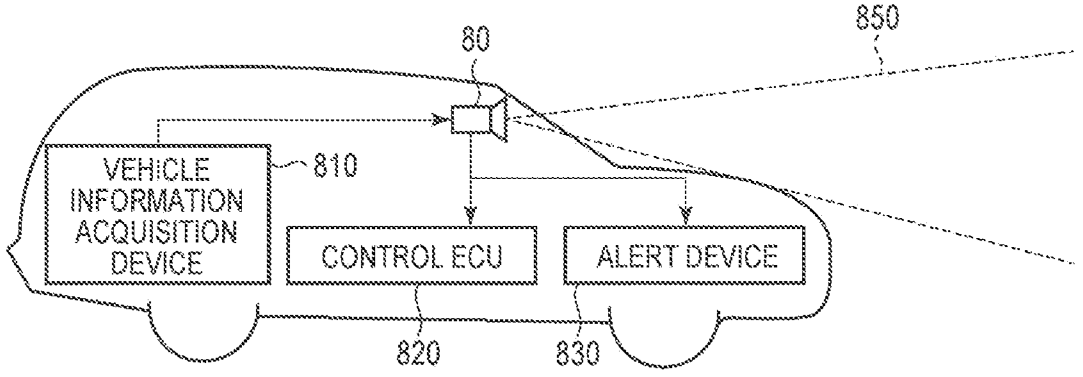

FIGS. 12A and 12B are block diagrams of equipment relating to the vehicle-mounted camera according to the present embodiment. The equipment 80 includes an imaging device 800 (an example of the photoelectric conversion device) of the above-described embodiments and a signal processing device (processing device) that processes a signal from the imaging device 800. The equipment 80 includes an image processing unit or circuit 801 that performs image processing on a plurality of pieces of image data acquired by the imaging device 800, and a parallax calculation unit or circuit 802 that calculates parallax (phase difference of parallax images) from the plurality of pieces of image data acquired by the equipment 80. The equipment 80 includes a distance measurement unit or circuit 803 that calculates a distance to an object based on the calculated parallax, and a collision determination unit or circuit 804 that determines whether or not there is a possibility of collision based on the calculated distance. Here, the parallax calculation circuit 802 and the distance measurement circuit 803 are examples of a distance information acquisition unit or circuit that acquires distance information to the object. That is, the distance information is information on a parallax, a defocus amount, a distance to the object, and the like. The collision determination circuit 804 may determine the possibility of collision using any of these pieces of distance information. The distance information acquisition circuit may be realized by dedicatedly designed hardware or software modules. Further, it may be realized by a field programmable gate array (FPGA), an application specific integrated circuit (ASIC) or a combination thereof.

The equipment 80 is connected to the vehicle information acquisition device 810, and can obtain vehicle information such as a vehicle speed, a yaw rate, and a steering angle. Further, the equipment 80 is connected to a control ECU 820 which is a control device that outputs a control signal for generating a braking force to the vehicle based on the determination result of the collision determination circuit 804. The equipment 80 is also connected to an alert device 830 that issues an alert to the driver based on the determination result of the collision determination circuit 804. For example, when the collision possibility is high as the determination result of the collision determination circuit 804, the control ECU 820 performs vehicle control to avoid collision or reduce damage by braking, returning an accelerator, suppressing engine output, or the like. The alert device 830 alerts the user by sounding an alarm such as a sound, displaying alert information on a screen of a car navigation system or the like, or giving vibration to a seat belt or a steering wheel. The equipment 80 functions as a control circuit that controls the operation of controlling the vehicle as described above.

In the present embodiment, an image of the periphery of the vehicle, for example, the front or the rear is captured by the equipment 80. FIG. 12B illustrates equipment in a case where an image is captured in front of the vehicle (image capturing range 850). The vehicle information acquisition device 810 as the imaging control circuit sends an instruction to the equipment 80 or the imaging device 800 to perform the imaging operation. With such a configuration, the accuracy of distance measurement can be further improved.

Although the example of control for avoiding a collision to another vehicle has been described above, the embodiment is applicable to automatic driving control for following another vehicle, automatic driving control for not going out of a traffic lane, or the like. Furthermore, the equipment is not limited to a vehicle such as an automobile and can be applied to a movable body (movable apparatus) such as a ship, an airplane, a satellite, an industrial robot and a consumer use robot, or the like, for example. In addition, the equipment can be widely applied to equipment which utilizes object recognition or biometric authentication, such as an intelligent transportation system (ITS), a surveillance system, or the like without being limited to movable bodies.

Modified Embodiments

The disclosure is not limited to the above embodiments, and various modifications are possible. For example, an example in which some of the configurations of any of the embodiments are added to other embodiments or an example in which some of the configurations of any of the embodiments are replaced with some of the configurations of other embodiments is also an embodiment of the disclosure.

The disclosure of this specification includes a complementary set of the concepts described in this specification. That is, for example, if a description of “A is B” (A=B) is provided in this specification, this specification is intended to disclose or suggest that “A is not B” even if a description of “A is not B” (A≠B) is omitted. This is because it is assumed that “A is not B” is considered when “A is B” is described.

Embodiment(s) of the disclosure can also be realized by a computer of a system or apparatus that reads out and executes computer executable instructions (e.g., one or more programs) recorded on a storage medium (which may also be referred to more fully as a ‘non-transitory computer-readable storage medium’) to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

It should be noted that any of the embodiments described above is merely an example of an embodiment for carrying out the disclosure, and the technical scope of the disclosure should not be construed as being limited by the embodiments. That is, the disclosure can be implemented in various forms without departing from the technical idea or the main features thereof.

According to the disclosure, there is provided a photoelectric conversion device capable of further expanding a dynamic range.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-086894, filed May 27, 2022, and Japanese Patent Application No. 2022-206388, filed Dec. 23, 2022 which are hereby incorporated by reference herein in their entirety.

What is claimed is:

1. A photoelectric conversion device comprising:

a first photoelectric conversion circuit having a first sensitivity;

a second photoelectric conversion circuit having a second sensitivity lower than the first sensitivity;

a floating diffusion portion to which charges generated in the first photoelectric conversion circuit and the second photoelectric conversion circuit are transferred;

a first transfer electrode configured to transfer charges from the first photoelectric conversion circuit to the floating diffusion portion;

a second transfer electrode configured to transfer charges from the second photoelectric conversion circuit to the floating diffusion portion; and a first control electrode configured to control a potential between the first photoelectric conversion circuit and the second photoelectric conversion circuit so that charges are movable between the first photoelectric conversion circuit and the second photoelectric conversion circuit, wherein in a plan view, an outer periphery of the first photoelectric conversion circuit has four or more sides, and the second photoelectric conversion circuit is arranged along two or more sides of the outer periphery of the first photoelectric conversion circuit.

2. The photoelectric conversion device according to claim 1 further comprising a first lens arranged to cover the first photoelectric conversion circuit and configured to guide incident light to the first photoelectric conversion circuit.

3. The photoelectric conversion device according to claim 2, wherein the first lens is arranged to further cover the second photoelectric conversion circuit, and configured to guide incident light to the first photoelectric conversion circuit and the second photoelectric conversion circuit.

4. The photoelectric conversion device according to claim 3, wherein an amount of light guided to the first photoelectric conversion circuit is greater than an amount of light guided to the second photoelectric conversion circuit.

5. The photoelectric conversion device according to claim 3, wherein the first photoelectric conversion circuit is arranged on an optical axis of the first lens, and wherein the second photoelectric conversion circuit is not arranged on the optical axis of the first lens.

6. The photoelectric conversion device according to claim 1 further comprising:

a first lens arranged to cover the first photoelectric conversion circuit and configured to guide incident light to the first photoelectric conversion circuit; and a second lens arranged to cover at least a part of the second photoelectric conversion circuit and configured to guide incident light to the second photoelectric conversion circuit.

7. The photoelectric conversion device according to claim 6, wherein an amount of light guided to the first photoelectric conversion circuit is greater than an amount of light guided to the second photoelectric conversion circuit.

8. The photoelectric conversion device according to claim 1, wherein an area of a light receiving face of the first photoelectric conversion circuit is larger than an area of a light receiving face of the second photoelectric conversion circuit.

9. The photoelectric conversion device according to claim 1, wherein impurity concentration of a semiconductor region constituting the first photoelectric conversion circuit is higher than impurity concentration of a semiconductor region constituting the second photoelectric conversion circuit.

10. The photoelectric conversion device according to claim 1, wherein in a light incident direction, a semiconductor region constituting the first photoelectric conversion circuit is longer than a semiconductor region constituting the second photoelectric conversion circuit.

11. The photoelectric conversion device according to claim 1 further comprising:

a first element isolation region that separates a region including the first photoelectric conversion circuit and the second photoelectric conversion circuit from another element; and a second element isolation region that separates the first photoelectric conversion circuit from the second photoelectric conversion circuit, wherein in a light incident direction, the first element isolation region is longer than the second element isolation region.

12. The photoelectric conversion device according to claim 1, wherein when illuminance is less than a predetermined threshold value, the potential is controlled so that charges are movable between the first photoelectric conversion circuit and the second photoelectric conversion circuit.

13. An apparatus comprising:

the photoelectric conversion device according to claim 1; and at least one of:

an optical device adapted for the photoelectric conversion device, a control device configured to control the photoelectric conversion device, a processing device configured to process a signal output from the photoelectric conversion device, a display device configured to display information obtained by the photoelectric conversion device, a storage device configured to store information obtained by the photoelectric conversion device, and a mechanical device configured to operate based on information obtained by the photoelectric conversion device.

14. The apparatus according to claim 13, wherein the processing device processes image signals that are generated by a plurality of photoelectric conversion circuits, respectively, and acquires distance information on a distance from the photoelectric conversion device to an object.

15. A photoelectric conversion device comprising:

a first photoelectric conversion circuit having a first sensitivity;

a second photoelectric conversion circuit having a second sensitivity lower than the first sensitivity;

a floating diffusion portion to which charges generated in the first photoelectric conversion circuit and the second photoelectric conversion circuit are transferred;

a first transfer electrode configured to transfer charges from the first photoelectric conversion circuit to the floating diffusion portion;

a second transfer electrode configured to transfer charges from the second photoelectric conversion circuit to the floating diffusion portion; and a first control electrode configured to control a potential between the first photoelectric conversion circuit and the second photoelectric conversion circuit so that charges are movable between the first photoelectric conversion circuit and the second photoelectric conversion circuit, wherein in a state in which charges are movable between the first photoelectric conversion circuit and the second photoelectric conversion circuit, transfer of charges from the first photoelectric conversion circuit and the second photoelectric conversion circuit to the floating diffusion portion is performed only by the first transfer electrode.

16. An photoelectric conversion device comprising:

a first photoelectric conversion circuit having a first sensitivity;

a second photoelectric conversion circuit having a second sensitivity lower than the first sensitivity;

a floating diffusion portion to which charges generated in the first photoelectric conversion circuit and the second photoelectric conversion circuit are transferred;

a first transfer electrode configured to transfer charges from the first photoelectric conversion circuit to the floating diffusion portion;

a second transfer electrode configured to transfer charges from the second photoelectric conversion circuit to the floating diffusion portion;

a first control electrode configured to control a potential between the first photoelectric conversion circuit and the second photoelectric conversion circuit so that charges are movable between the first photoelectric conversion circuit and the second photoelectric conversion circuit;

a third photoelectric conversion circuit having a third sensitivity lower than the first sensitivity;

a third transfer electrode configured to transfer charges from the third photoelectric conversion circuit to the floating diffusion portion; and a second control electrode configured to control a potential between the first photoelectric conversion circuit and the third photoelectric conversion circuit so that charges are movable between the first photoelectric conversion circuit and the third photoelectric conversion circuit.

17. The photoelectric conversion device according to claim 16, wherein in a plan view, the second photoelectric conversion circuit and the third photoelectric conversion circuit are arranged so as to surround the first photoelectric conversion circuit.

* * * * *